United States Patent
Liu et al.

(10) Patent No.: US 9,768,351 B2
(45) Date of Patent: Sep. 19, 2017

(54) OPTOELECTRONIC SEMICONDUCTOR DEVICE WITH BARRIER LAYER

(71) Applicant: EPISTAR CORPORATION, Hsinchu (TW)

(72) Inventors: Tsung-Hsien Liu, Hsinchu (TW); Rong-Ren Lee, Hsinchu (TW); Shih-Chang Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 281 days.

(21) Appl. No.: 14/475,210

(22) Filed: Sep. 2, 2014

(65) Prior Publication Data
US 2015/0060877 A1  Mar. 5, 2015

(30) Foreign Application Priority Data

Aug. 30, 2013  (TW) .............................. 102131493 A

(51) Int. Cl.
| H01L 33/30 | (2010.01) |
| H01L 33/08 | (2010.01) |
| H01L 33/06 | (2010.01) |
| H01L 33/02 | (2010.01) |
| H01L 33/04 | (2010.01) |

(52) U.S. Cl.
CPC ............ H01L 33/08 (2013.01); H01L 33/025 (2013.01); H01L 33/04 (2013.01); H01L 33/06 (2013.01); H01L 33/305 (2013.01)

(58) Field of Classification Search
CPC ....... H01L 33/025; H01L 33/04; H01L 33/06; H01L 33/08; H01L 33/305
See application file for complete search history.

(56) References Cited

U.S. PATENT DOCUMENTS

| 4,131,904 A | * | 12/1978 | Ladany | ................. H01L 33/305 117/57 |
| 5,740,192 A | * | 4/1998 | Hatano | ............... H01S 5/32341 257/101 |
| 5,800,630 A | * | 9/1998 | Vilela | ............... H01L 31/03042 136/249 |
| 5,814,838 A | * | 9/1998 | Ohtsuka | ................. H01L 33/025 257/102 |

(Continued)

FOREIGN PATENT DOCUMENTS

JP  9-55522  *  2/1997 ............. H01L 31/04

OTHER PUBLICATIONS

Skachkov, GaInP Semiconductor Compounds Doped with the Sb Isovalent Impurity, Semiconductors, 2015, vol. 49, No. 5. pp. 579-581.*

Primary Examiner — Mary Wilczewski
(74) Attorney, Agent, or Firm — Muncy, Geissler, Olds & Lowe, P.C.

(57) ABSTRACT

An optoelectronic semiconductor device comprises a barrier layer, a first semiconductor layer on the barrier layer, the first semiconductor layer comprising a first dopant and a second dopant, and a second semiconductor layer beneath the barrier layer, the second semiconductor comprising the second dopant, wherein, in the first semiconductor layer, a concentration of the first dopant is larger than a concentration of the second dopant, and the concentration of the second dopant in the second semiconductor layer is larger than that in the first semiconductor layer.

19 Claims, 5 Drawing Sheets

(56) References Cited

U.S. PATENT DOCUMENTS

| | | | | |
|---|---|---|---|---|
| 5,814,839 A * | 9/1998 | Hosoba | H01L 33/145 | 257/102 |
| 5,998,810 A * | 12/1999 | Hatano | H01S 5/32341 | 257/101 |
| 6,060,335 A * | 5/2000 | Rennie | B82Y 20/00 | 148/DIG. 95 |
| 6,251,802 B1 * | 6/2001 | Moore | H01L 21/3146 | 257/E21.008 |
| 6,472,298 B2 * | 10/2002 | Iyechika | H01L 29/201 | 117/104 |
| 6,586,779 B2 | 7/2003 | Tsuda et al. | | |
| 6,653,248 B2 * | 11/2003 | Kean | H01L 21/2233 | 257/191 |
| 6,686,610 B2 * | 2/2004 | Sheu | H01L 33/04 | 257/102 |
| 6,720,571 B1 * | 4/2004 | Tu | B82Y 20/00 | 257/15 |
| 6,771,680 B2 * | 8/2004 | Bour | B82Y 20/00 | 372/43.01 |
| 7,063,997 B2 * | 6/2006 | Cho | H01L 21/0237 | 257/E21.11 |
| 7,078,256 B2 * | 7/2006 | Ryu | H01L 33/007 | 438/39 |
| 7,176,479 B2 * | 2/2007 | Ohba | H01L 21/0242 | 257/101 |
| 7,180,923 B2 * | 2/2007 | Bour | H01S 5/18358 | 372/43.01 |
| 7,663,138 B2 * | 2/2010 | Fujikura | B82Y 20/00 | 257/101 |
| 8,080,818 B2 * | 12/2011 | Tanaka | B82Y 20/00 | 257/101 |
| 8,421,056 B2 * | 4/2013 | Takeuchi | H01L 33/025 | 257/100 |
| 8,940,624 B2 * | 1/2015 | Kawanishi | H01L 21/0242 | 438/40 |
| 2002/0053676 A1 * | 5/2002 | Kozaki | B82Y 20/00 | 257/88 |
| 2004/0076209 A1 * | 4/2004 | Bour | B82Y 20/00 | 372/45.01 |
| 2005/0253222 A1 * | 11/2005 | Caneau | B82Y 20/00 | 257/607 |
| 2007/0034853 A1 * | 2/2007 | Robbins | H01S 5/305 | 257/13 |
| 2009/0090900 A1 * | 4/2009 | Avramescu | B82Y 20/00 | 257/13 |
| 2010/0224855 A1 * | 9/2010 | Takeuchi | H01L 33/025 | 257/13 |
| 2010/0301454 A1 * | 12/2010 | Zhang | H01L 31/0687 | 257/614 |
| 2011/0012088 A1 * | 1/2011 | Strassburg | H01L 33/04 | 257/13 |
| 2012/0279750 A1 * | 11/2012 | Lund | H01B 7/045 | 174/107 |
| 2014/0191193 A1 * | 7/2014 | Choi | H01L 33/14 | 257/13 |
| 2014/0339598 A1 * | 11/2014 | Park | H01L 33/325 | 257/101 |
| 2015/0060877 A1 * | 3/2015 | Liu | H01L 33/025 | 257/76 |
| 2015/0349197 A1 * | 12/2015 | Watanabe | H01L 33/025 | 257/13 |

* cited by examiner

OPTOELECTRONIC SEMICONDUCTOR DEVICE WITH BARRIER LAYER

TECHNICAL FIELD

The application is related to a structure of an optoelectronic semiconductor device.

RELATED APPLICATION DATA

This application claims the right of priority of TW Application No. 102131493, filed on Aug. 30, 2013, and the content of which is hereby incorporated by reference in its entirety.

DESCRIPTION OF BACKGROUND ART

The brightness of the optoelectronic device like LED is improved continuously in recent years, and the application field has been expanded from traditional indicator or ornament to the light source of all kinds of device. It is expected that in the coming future LED can replace traditional fluorescent light and be a light source of the next generation.

As shown in FIG. 1, the conventional LED structure has a single p-n junction. The basic structure comprises a substrate 13, an n-type semiconductor layer 11 on the substrate 13, a p-type semiconductor layer 12 on the n-type semiconductor layer 11, and a light-emitting layer 10 between the p-type semiconductor layer 12 and the n-type semiconductor layer 11.

As shown in FIG. 2, in order to improve the light extraction of unit area of an LED, the LED structure with multiple light-emitting stacks uses a tunnel layer 17 to connect the first p-n junction structure I and the second p-n junction structure II so the light extraction of unit area of the LED can be improved and the driving voltage of the LED is double. However, the driving current of the LED is not increased. The characteristic of high driving voltage and low driving current of LED is advantageous to lighting products. The tunnel layer 17 comprises a highly doped n+-type semiconductor layer and a highly doped p+-type semiconductor layer. Since the highly doped n+-type and the highly doped p+-type semiconductor layers have low light transmittance, the tunnel layer 17 should be thin for improving the light transmittance. However, if the tunnel layer 17 is too thin, dopants diffused from other semiconductor layers dope into the tunnel layer 17 easily and affect the function of the tunnel layer.

SUMMARY OF THE DISCLOSURE

An optoelectronic semiconductor device comprises a barrier layer, a first semiconductor layer on the barrier layer, the first semiconductor layer comprising a first dopant and a second dopant, and a second semiconductor layer beneath the barrier layer, the second semiconductor comprising the second dopant, wherein, in the first semiconductor layer, a concentration of the first dopant is larger than a concentration of the second dopant, and the concentration of the second dopant in the second semiconductor layer is larger than that in the first semiconductor layer.

DETAILED DESCRIPTION OF PREFERRED EMBODIMENTS

First Embodiment

Figure 1:
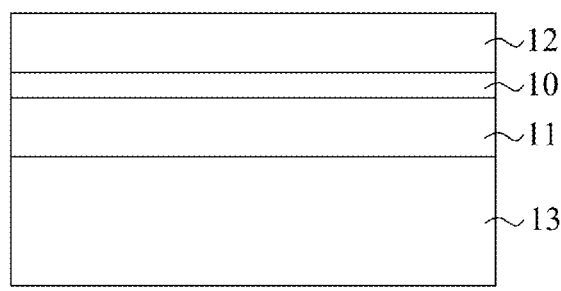
FIG. 1 shows a diagram of a conventional LED structure having a single p-n junction.
Figure 2:
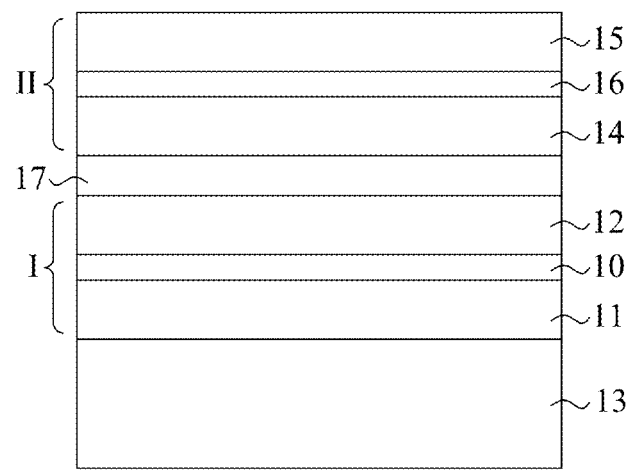
FIG. 2 shows a diagram of a conventional LED structure having multiple light-emitting stacks.
Figure 3:
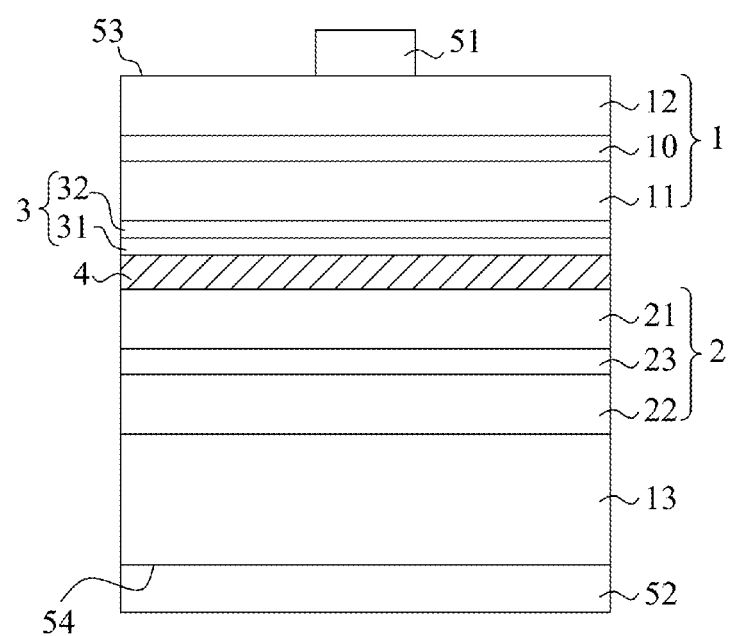
FIG. 3 shows a structure in accordance with the first embodiment of the application.

FIG. 3 shows an optoelectronic semiconductor device in accordance with the first embodiment of the application. The optoelectronic semiconductor device disclosed in the embodiment has double p-n junctions comprising a first semiconductor stack 1 and a second semiconductor stack 2 on a substrate 13, wherein the first semiconductor stack 1 is on the second semiconductor stack 2, a tunnel layer 3 between the first semiconductor stack 1 and the second semiconductor stack 2, a barrier layer 4 between the tunnel layer 3 and the second semiconductor stack 2, a first electrode 51 disposed on the surface 53 of the first semiconductor stack 1, and a second electrode 52 disposed on the surface 54 of the substrate 13. The first electrode 51 and the second electrode 52 are used for conducting electrical current flowing through the first semiconductor stack 1 and the second semiconductor stack 2.

The substrate 13 is an electrically conductive substrate comprising Si, GaAs, SiC, ZnO, GaN, AlN, metal material or the combination thereof.

The first semiconductor stack 1, the second semiconductor stack 2, the tunnel layer 3 and the barrier layer 4 can be formed on the substrate 13 by epitaxial growth method, or by alignment bonding method with heat and pressure to be bonded with the substrate 13.

The first semiconductor stack 1 comprises a first n-type semiconductor layer 11 having a first type electrical conductivity, a first light-emitting layer 10 and a first p-type semiconductor layer 12 having a second type electrical conductivity. The second semiconductor stack 2 comprises a second n-type semiconductor layer 22 having a first type electrical conductivity, a second light-emitting layer 23 and a second p-type semiconductor layer 21 having a second type electrical conductivity. The first semiconductor stack 1 and the second semiconductor stack 2 epitaxially grow on the substrate 13 sequentially. The first n-type semiconductor layer 11, the first p-type semiconductor layer 12, the second n-type semiconductor layer 22 and the second p-type semiconductor layer 21 can be a single layer or multiple layers (multiple layers means two or more layers). The first n-type semiconductor layer 11 and the first p-type semiconductor layer 12 have different conductivities, electrical properties, and polarities or provide electrons or holes by being doped different elements; the second n-type semiconductor layer 22 and the second p-type semiconductor layer 21 also have different conductivities, electrical properties, and polarities, and provide electrons or holes by being doped different elements. The first light-emitting layer 10 is formed between the first n-type semiconductor layer 11 and the first p-type semiconductor layer 12, and the second light-emitting layer 23 is formed between the second n-type semiconductor layer 22 and the second p-type semiconductor layer 21. The first light-emitting layer 10 and the second light-emitting layer 23 can transfer the electrical power into light. By changing the physical and chemical properties of one layer or multiple layers of the first semiconductor stack 1 and the second semiconductor stack 2, the wavelength of the light can be adjusted. The known material of the first semiconductor stack 1 and the second semiconductor stack 2 is aluminum gallium indium phosphide (AlGaInP) series, aluminum gallium indium nitride (AlGaInN) series and zinc oxide (ZnO) series. The first light-emitting layer 10 and the second light-emitting layer 23 can be ingle heterostructure (SH), double heterostructure (DH), double-side double heterostructure (DDH) or multi-quantum well (MWQ) structure. To be more specific, the first light-emitting layer 10 and the second light-emitting layer 23 can be intrinsic, p-type or n-type semiconductor. As electrical current flows through the first semiconductor stack 1 and the second semiconductor stack 2, the first light-emitting layer 10 and the second light-emitting layer 23 are capable of emitting light. As the first light-emitting layer 10 and the second light-emitting layer 23 are made of the series of aluminum gallium indium phosphide (AlGaInP), the first light-emitting layer 10 and the second light-emitting layer 23 are able to emit red, orange, yellow, or amber light. As the first light-emitting layer 10 and the second light-emitting layer 23 are made of the series of aluminum gallium indium nitride (AlGaInN), the first light-emitting layer 10 and the second light-emitting layer 23 are able to emit blue or green light. In the embodiment, the material of the first semiconductor stack 1 and the second semiconductor stack 2 is the series of aluminum gallium indium phosphide (AlGaInP), the first p-type semiconductor layer 12 and the second p-type semiconductor layer 21 are doped with Mg or Zn, wherein the concentrations of Mg or Zn in the first p-type semiconductor layer 12 and the second p-type semiconductor layer 21 are larger than $10^{17}$ cm$^{-3}$, preferably between $3*10^{17}$ cm$^{-3}$~$5*10^{17}$ cm$^{-3}$. The first n-type semiconductor layer 11 and the second n-type semiconductor layer 22 are doped with Si, wherein the concentrations of Si in the first n-type semiconductor layer 11 and the second n-type semiconductor layer 22 are between $10^{17}$ cm$^{-3}$~$10^{18}$ cm$^{-3}$, preferably between $4*10^{17}$ cm$^{-3}$~$6*10^{17}$ cm$^{-3}$.

A tunnel layer 3 is between the first semiconductor stack 1 and the second semiconductor stack 2. An electrical current can flow through the tunnel layer 3 due to the tunneling effect so the electrical current can flow through the first semiconductor stack 1 and the second semiconductor stack 2 at the same time. The material of the tunnel layer 3 comprises one or more elements selected from the group of Ga, Al, In, P, As, N, Zn, and Cd. The tunnel layer 3 comprises a first electrical tunnel layer 31 and a second electrical tunnel layer 32, wherein the first electrical tunnel layer 31 is near the second semiconductor stack 2, and the polarities of the first electrical tunnel layer 31 and the second p-type semiconductor layer 21 are the same. In the embodiment, the first electrical tunnel layer 31 and the second p-type semiconductor layer 21 are both p-type semiconductor. The first electrical tunnel layer 31 is the compound comprising Al, Ga, or As and doped with a first dopant and a second dopant. In the present embodiment, the first dopant is C and has a concentration between $10^{19}$ cm$^{-3}$~$10^{21}$ cm$^{-3}$, preferably between $10^{19}$ cm$^{-3}$~$5*10^{20}$ cm$^{-3}$. The second dopant is Mg or Zn and has a concentration smaller than $10^{18}$ cm$^{-3}$, preferably smaller than $10^{17}$ cm$^{-3}$. The concentration of the first dopant is 10 times, preferably 100 times, larger than that of the second dopant. The first dopant of the first electrical tunnel layer 31, such as C, is an intentional dopant, which makes the first electrical tunnel layer 31 to be a highly doped p-type semiconductor. The second dopant of the first electrical tunnel layer 31, such as Mg or Zn, is an unintentional dopant, which diffuses from the second p-type semiconductor layer 21. The second electrical tunnel layer 32 is near the first semiconductor stack 1 and the polarities of the second electrical tunnel layer 32 and the first semiconductor stack 1 are the same. In the embodiment, the second electrical tunnel layer 32 and the first semiconductor stack 1 are n-type semiconductor. The second electrical tunnel layer 32 is the compound comprising In, Ga, or P and doped with Te, wherein the concentration of Te is between $10^{19}$ cm$^{-3}$~$10^{21}$ cm$^{-3}$, preferably between $10^{19}$ cm$^{-3}$~$2*10^{20}$ cm$^{-3}$.

Figure 4A:
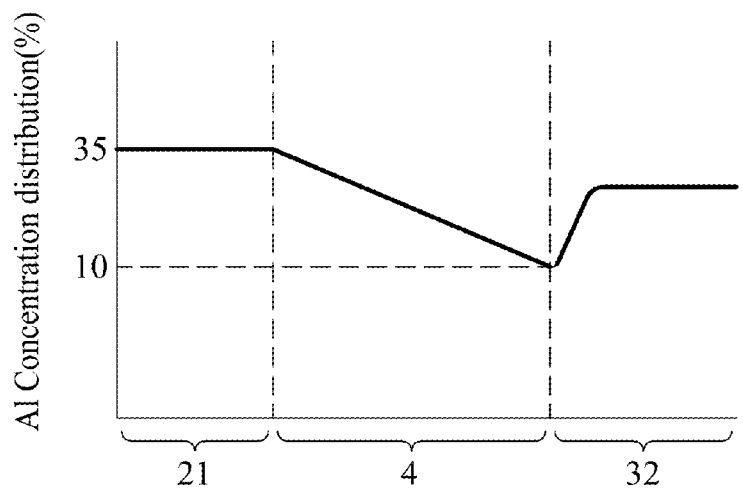
FIGS. 4A~4B show Al concentration distribution in accordance with the first embodiment of the application.
Figure 4B:
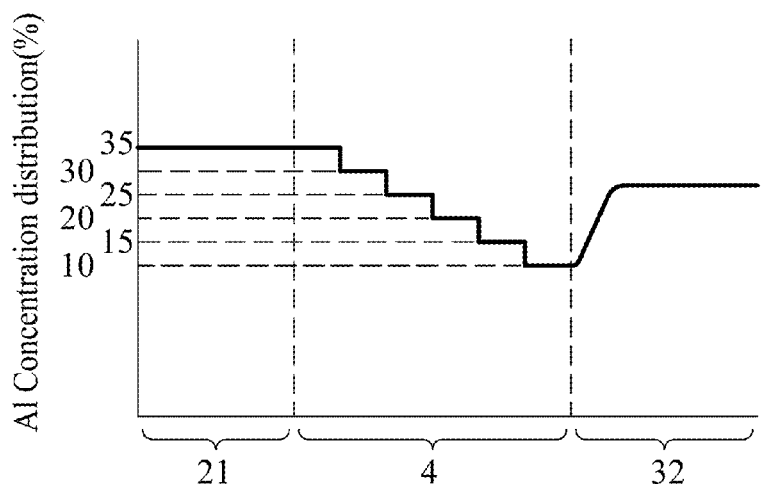

A barrier layer 4 between the second p-type semiconductor layer 21 and the first electrical tunnel layer 31 is a compound comprising Al, Ga, In, or P, which can be Al$_x$Ga$_{1-x}$InP, wherein x is between 0.05~0.95, preferably between 0.2~0.7, and x declines from the portion near the second p-type semiconductor layer 21 to the portion near the first electrical tunnel layer 31 in stepped type or linearly. Therefore, as the Al concentration distribution shown in FIGS. 4A and 4B, in the barrier layer 4, the concentration of Al in the portion near the second p-type semiconductor layer 21 is about 35% and declines linearly (FIG. 4A) or in stepped type (FIG. 4B) to the portion near the first electrical tunnel layer 31, in which the concentration of Al is about 10%. Since the barrier layer 4 is epitaxially grown on the second semiconductor stack 2 firstly and then the first electrical tunnel layer 31 is epitaxially grown on the barrier layer 4, during the epitaxial growth process, the barrier layer 4 is able to prevent the dopant of the second semiconductor stack 2, such as Mg and Zn, from diffusing to the first electrical tunnel layer 31. If there is no barrier layer 4 formed between the second p-type semiconductor layer 21 and the first electrical tunnel layer 31, a great quantity of the second dopant of the second semiconductor stack 2, such as Mg and Zn, can diffuse to the first electrical tunnel layer 31 and increase the concentration of the second dopant in the first electrical tunnel layer 31. As the concentration of the second dopant is higher than $10^{18}$ cm$^{-3}$, the resistance of the first electrical tunnel layer 31 is increased, and the forward voltage (Vf) of the optoelectronic semiconductor device is increased that decreases the efficiency.

Figure 5A:
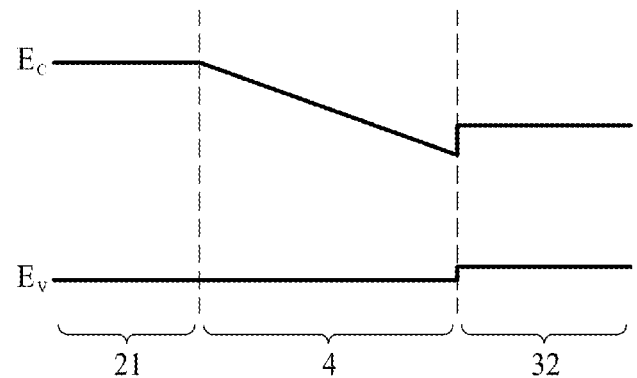
FIGS. 5A~5B show bandgap diagram (Ec-Ev) in accordance with the first embodiment of the application.
Figure 5B:
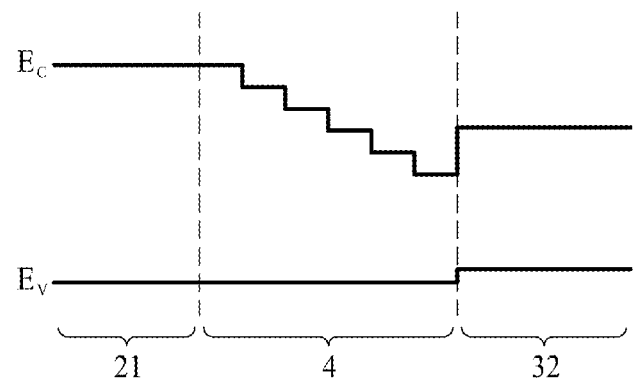

In the barrier layer 4, since the concentration of Al in the portion near the second p-type semiconductor layer 21 is about 35% and declines linearly or in stepped type to the portion near the first electrical tunnel layer 31, in which the concentration of Al is about 10%, as shown in FIGS. 5A and 5B, the bandgap (Ec−Ev) declines linearly (FIG. 5A) or in stepped type (FIG. 5B) from the portion near the second p-type semiconductor layer 21 to the portion near the first electrical tunnel layer 31. The linearly gradual change or stepped gradual change of the bandgap (Ec−Ev) is capable of preventing the electrons from being blocked during the transmission for lowering the forward voltage (Vf).

Second Embodiment

The difference between the second embodiment and the first embodiment is that the barrier layer 4 is a compound comprising Al, Ga, In or P, which can be Al$_x$Ga$_{1-x}$InP, wherein x is between 0.05~0.95, preferably between 0.2~0.7, doped with Sb, wherein the concentration of Sb is between $10^{17}$ cm$^{-3}$~$10^{18}$ cm$^{-3}$. During the epitaxial growth process, the barrier layer 4 doped with Sb is able to prevent the dopant of the second semiconductor stack 2, such as Mg or Zn, from diffusing to the first electrical tunnel layer 31 for avoiding the concentration of the second dopant of the first electrical tunnel layer 31 being over $10^{18}$ cm$^{-3}$, preferably over $10^{17}$ cm$^{-3}$.

Figure 6:
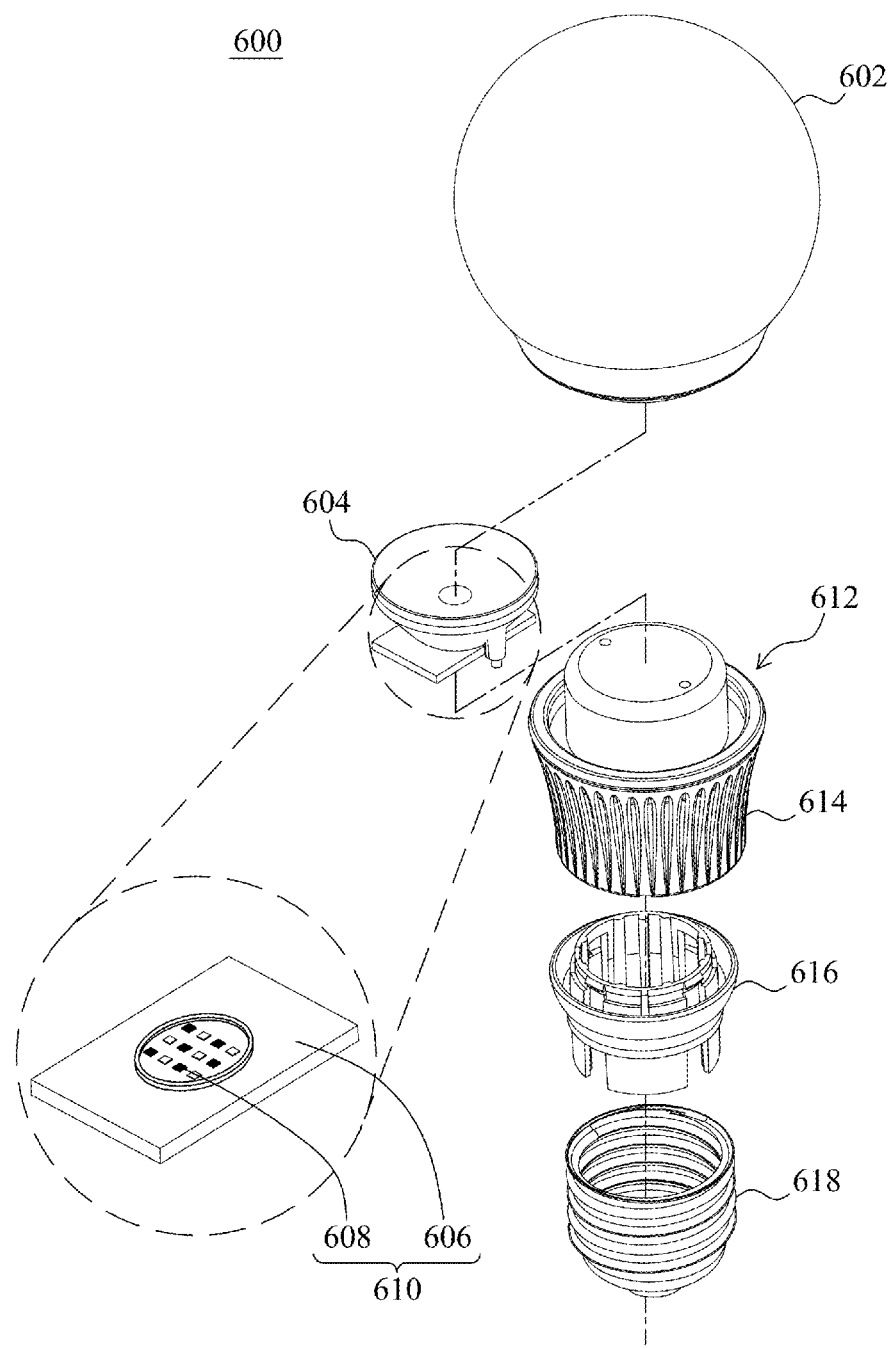
FIG. 6 shows a structure in accordance with another embodiment of the application.

FIG. 6 shows a structure in accordance with another embodiment of the application. A light bulb 600 comprises a housing 602, a lens 604, a light module 610, a holder 612, a heat sink 614, a connecting portion 616 and an electrical connector. The light module 610 comprises a carrier 606 and multiple abovementioned optoelectronic semiconductor devices 608 on the carrier 606.

Although the present application has been explained above, it is not the limitation of the range, the sequence in practice, the material in practice, or the method in practice. Any modification or decoration for present application is not detached from the spirit and the range of such.

What is claimed is:

1. An optoelectronic semiconductor device, comprising:
    a barrier layer;
    a first semiconductor layer on the barrier layer, the first semiconductor layer comprising a first dopant and a second dopant; and
    a second semiconductor layer beneath the barrier layer, the second semiconductor comprising the second dopant,
    wherein, in the first semiconductor layer, a concentration of the first dopant is larger than a concentration of the second dopant, and a concentration of the second dopant in the second semiconductor layer is larger than that in the first semiconductor layer, and
    wherein the barrier layer comprises Al$_x$Ga$_{1-x}$InP and x decreases in the barrier layer from a portion near the second semiconductor layer to a portion near the first semiconductor layer,
    wherein the first dopant is C and the second dopant is Mg or Zn.

2. The optoelectronic semiconductor device according to claim 1, further comprising a first semiconductor stack comprising a first light-emitting layer on the first semiconductor layer;
    a second semiconductor stack comprising a second light-emitting layer beneath the barrier layer, wherein the second semiconductor stack comprises the second semiconductor layer between the second light-emitting layer and the barrier layer; and
    a tunnel layer between the first semiconductor stack and the barrier layer, wherein the tunnel layer comprises the first semiconductor layer.

3. The optoelectronic semiconductor device according to claim 1, wherein the concentration of the first dopant is larger than $10^{19}$ cm$^{-3}$.

4. The optoelectronic semiconductor device according to claim 3, wherein the first dopant comprises C.

5. The optoelectronic semiconductor device according to claim 1, wherein the concentration of the second dopant is smaller than $10^{18}$ cm-3.

6. The optoelectronic semiconductor device according to claim 5, wherein the second dopant comprises Mg or Zn.

7. The optoelectronic semiconductor device according to claim 1, wherein 0.2≤x≤0.7.

8. The optoelectronic semiconductor device according to claim 1, wherein x decreases in the barrier layer linearly or in stepped type.

9. The optoelectronic semiconductor device according to claim 1, wherein the barrier layer comprises Sb having a concentration between $10^{17}$-$10^{18}$ cm$^{-3}$.

10. The optoelectronic semiconductor device according to claim 2, wherein the first semiconductor stack further comprises a first p-type semiconductor on the first light-emitting layer and a first n-type semiconductor beneath the first light-emitting layer; the second semiconductor stack further comprises a second n-type semiconductor beneath the second light-emitting layer, wherein the second semiconductor layer is a p-type semiconductor; the tunnel layer further comprises a third semiconductor layer between the first semiconductor layer and the first light-emitting layer.

11. The optoelectronic semiconductor device according to claim 10, wherein the third semiconductor layer comprises a third dopant which is different from the second dopant.

12. The optoelectronic semiconductor device according to claim 11, wherein the third dopant comprises Te having a concentration larger than $10^{19}$ cm$^{-3}$.

13. The optoelectronic semiconductor device according to claim 2, further comprising a substrate on the first semiconductor layer or on the second semiconductor layer.

14. The optoelectronic semiconductor device according to claim 2, wherein a light emitted from the first light-emitting layer has a first wavelength, a light emitted from the second light-emitting layer has a second wavelength, and the difference in wavelength between the first wavelength and the second wavelength is smaller than 20 nm.

15. The optoelectronic semiconductor device according to claim 1, wherein the concentration of the first dopant is 10 times larger than the concentration of the second dopant.

16. The optoelectronic semiconductor device according to claim 1, wherein the barrier layer; comprises a group III element, and a percentage of the group III element decreases in the barrier layer from the portion near the second semiconductor layer to the portion near the first semiconductor layer.

17. The optoelectronic semiconductor device according to claim 1, wherein the first dopant and the second dopant have the same electrical conductivity.

18. The optoelectronic semiconductor device according to claim 1, wherein the barrier layer has bandgap which decrease from the portion near the second semiconductor layer to the portion near the first semiconductor layer.

19. The optoelectronic semiconductor device according to claim 18, wherein the bandgap of the portion of the barrier layer near the second semiconductor layer is between 2.3 eV-2.5 eV, and the bandgap of the portion of the barrier layer near the first semiconductor layer is between 1.9 eV-2.1 eV.

* * * * *